United States Patent
Zhou

(10) Patent No.: US 6,985,020 B2
(45) Date of Patent: Jan. 10, 2006

(54) INLINE PREDISTORTION FOR BOTH CSO AND CTB CORRECTION

(75) Inventor: Shutong Zhou, Lansdale, PA (US)

(73) Assignee: General Instrument Corporation, Horsham, PA (US)

(*) Notice: Subject to any disclaimer, the term of this patent is extended or adjusted under 35 U.S.C. 154(b) by 94 days.

(21) Appl. No.: 10/191,557

(22) Filed: Jul. 9, 2002

(65) Prior Publication Data

US 2004/0008083 A1 Jan. 15, 2004

(51) Int. Cl.
H03K 5/08 (2006.01)

(52) U.S. Cl. ............... 327/317; 327/318; 330/149
(58) Field of Classification Search ............ 327/317, 327/318, 58; 330/144, 145, 149, 289, 66; 375/296; 445/91
See application file for complete search history.

(56) References Cited

U.S. PATENT DOCUMENTS

| 4,808,810 A | 2/1989 | Van Doorn .......... 250/214 A |
| 4,882,482 A | 11/1989 | Smith et al. ......... 250/214 A |
| 4,992,754 A | 2/1991 | Blauvelt et al. ......... 330/149 |

(Continued)

FOREIGN PATENT DOCUMENTS

| DE | 3024533 | 1/1982 |
| DE | 3338024 | 5/1985 |
| DE | 4212772 | 10/1993 |
| DE | 2656436 | 6/1998 |
| EP | 0498456 | 2/1992 |
| EP | 0552316 | 2/1992 |
| EP | 0486953 | 5/1992 |
| EP | 0620661 | 10/1994 |
| GB | 1381597 | 1/1975 |
| GB | 2164515 | 3/1986 |
| WO | 9735390 | 9/1997 |

OTHER PUBLICATIONS

Optical Receiver Front–End Nonlinear Distortion, Electronics Letters, Apr. 29, 1982, vol. 18, No. 9, pp. 361–362.
Bertelsmeier et al., Linearization of Broadband Optical Transmission Systems by Adaptive Predistortion, 1984, pp. 206–212.
Ha, Solid–State Microwave Amplifier Design, pp. 202–217.
Ohr, GaAs Finds Home In Wireless & High–Speed Data–Communications Applications, Computer Design, Mar. 1994, pp. 59–68.

(Continued)

Primary Examiner—Tuan T. Lam
Assistant Examiner—Hiep Nguyen
(74) Attorney, Agent, or Firm—Volpe and Koenig, P.C.

(57) ABSTRACT

An inline predistortion circuit for producing composite second order (CSO) and composite triple beat (CTB) distortion correction of a laser transmitter is disclosed having an RF input signal, a diode for producing nonlinear current, and a DC voltage bias for controlling the nonlinear current. The predistortion circuit lacks DC blocking capacitors between the RF attenuator and the diode, which results in improved nonlinear current generation across a wide frequency range. A capacitor in parallel with the bias circuit further increases diode's capability for producing nonlinear current. A low resistance resistor in series with the RF signal path and in parallel with the diode provides the voltage necessary for the diode to conduct while minimizing RF signal attenuation. An inductor in series with the RF signal provides improved phase correction of the CSO and CTB predistortion circuit. A temperature compensation circuit is also integrated into the circuit to reduce the effect of temperature variations on the correction circuit.

11 Claims, 5 Drawing Sheets

U.S. PATENT DOCUMENTS

| | | | |
|---|---|---|---|
| 4,998,012 A | | 3/1991 | Kruse ......................... 250/214 |
| 5,161,044 A | | 11/1992 | Nazarathy et al. ........... 359/157 |
| 5,172,068 A | | 12/1992 | Childs ......................... 328/162 |
| 5,321,710 A | | 6/1994 | Cornish et al. ............... 372/26 |
| 5,418,637 A | | 5/1995 | Kuo ............................. 359/161 |
| 5,424,680 A | | 6/1995 | Nazarathy et al. ........... 359/161 |
| 5,455,705 A | | 10/1995 | Gusinov ...................... 359/189 |
| 5,481,389 A | | 1/1996 | Pidgeon et al. .............. 359/161 |
| 5,523,716 A | | 6/1996 | Grebliunas et al. .......... 330/149 |
| 5,568,087 A | | 10/1996 | Gatti ........................... 330/149 |
| 5,589,797 A | | 12/1996 | Gans et al. .................. 330/149 |
| 5,600,472 A | | 2/1997 | Uesaka ........................ 359/161 |
| 5,703,530 A | | 12/1997 | Sato et al. ................... 330/149 |
| 5,752,174 A | | 5/1998 | Matai et al. .............. 455/183.1 |
| 5,770,430 A | * | 6/1998 | Howell et al. ............... 435/325 |
| 5,798,854 A | * | 8/1998 | Blauvelt et al. ............. 398/194 |
| 5,850,305 A | | 12/1998 | Pidgeon ....................... 359/187 |
| 5,909,642 A | * | 6/1999 | Suzuki ..................... 455/114.3 |
| 6,069,534 A | | 5/2000 | Kobayashi ................... 330/308 |
| 6,107,877 A | * | 8/2000 | Miguelez et al. ............. 330/66 |
| 6,122,085 A | | 9/2000 | Bitler .......................... 359/180 |
| 6,204,718 B1 | | 3/2001 | Pidgeon, Jr. ................. 327/318 |
| 6,577,177 B2 | * | 6/2003 | Zhou et al. .................. 327/317 |

OTHER PUBLICATIONS

Personick, Optical Fiber Transmission Systems Applications of Communications Theory, pp. 62–75.

Eggers, 2GHz Bandwidth Predistortion Linearizer For Microwave Power Amplifiers At Ku–Band, pp. 1501–1505, Sep. 1994.

Eggers, Pamela—Linearized Solid State Power Amplifier At Ku–band Frequency, pp. 443–445, Sep. 1993.

Khilla et al., Semiconductor Transmitter Amplifiers And Traveling Wave Tube Linears For Future Communications Satellites, 8273 ANT Telecommunications Engineering Reports, No. 8, Feb. 1991 (including English translation).

Locatelli et al., Microwave Linear Power Amplifier With Micromodule Technology, pp. 1.3.1–1.3.6, Jun. 1987.

Kobayashi et al., A Novel Monolithic Linearized HEMT LNA Using HBT Tuneable Active Feedback, IEEE MTT–S International Microwave Symposium Digest, pp. 1217–1220, Jun. 1996.

* cited by examiner

INLINE PREDISTORTION FOR BOTH CSO AND CTB CORRECTION

BACKGROUND OF THE INVENTION

1. Field of the Invention

This invention is related to semiconductor lasers and, more particularly, to a method and apparatus for providing composite second order (CSO) and composite triple beat (CTB), or third order, distortion correction for semiconductor lasers.

2. Background

Directly modulating the analog intensity of a distributed feedback (DFB) laser is widely used to transmit analog signals, such as sound or video signals and data, on optical fibers over a long distance. Such an amplitude modulation signal typically suffers from nonlinearity of the optical source. DFB lasers are limited primarily by CSO second order distortion.

Reducing the distortion of an optical laser transmitter or other electric devices has been studied for some time. It has been increasingly necessary to extend the operation of optical laser devices into high power and larger optical modulation index (OMI) depth. Pushing a laser to an optical level output higher than its rated level is favorable, since an upgrade in optical power level is essentially achieved using lower grade, low cost lasers. Typically, the carrier to noise ratio of a laser transmitter is limited by the non-linearity of the DFB laser diode. This non-linearity results in optical modulation depth limitations and primarily CSO distortions that are impressed upon the signal transmitted. Operating the laser at or above its peak optical power rating also introduces CTB distortion. Improvements to the optical output power, the system dynamic range and the carrier-to-noise ratio can be achieved by reducing the nonlinear CSO and CTB distortions produced by the laser transmitter. Accordingly, minimizing these distortions is paramount to efficient laser operation.

Three basic ways of improving laser transmitter distortion performance include: 1) feed-forward technique; 2) multi-path predistortion technique; and 3) inline predistortion technique.

The first method is the feed forward technique. Using this technique, the input signal of the laser transmitter is sampled and compared to the laser output signal to determine the difference between the signals. From this difference, the distortion component is extracted. This distortion component is then amplified by an auxiliary amplification circuit, converted back to an optical signal by another optical source, and combined with the optical output of the laser circuit such that the two distortion components cancel each other. Although this improves the distortion characteristics of the laser, the power consumed by the auxiliary amplification circuit is undesirable. This circuitry is also complex and costly.

The second method is the multipath distortion technique, in which the input source signal is split between two or more separate distortion producing paths connected in parallel. This technique requires complex system components and adjustment, thus increasing the cost and reducing the system reliability.

The third method is the inline predistortion technique, in which the input RF signal is passed in series through a distortion-producing path before the RF signal is input to the DFB laser. In this technique, nonlinear devices generate a predistortion signal that is equal in amplitude but opposite in phase to the distortion component generated by the laser. Canceling the distortion produced by the laser improves the operating characteristics of the laser. However, prior art predistortion circuits designed for correcting CSO distortion actually produce CTB distortion. Even with this limitation, inline predistortion is the simplest technique for laser distortion correction and is the favored method addressed hereinafter.

U.S. Pat. No. 5,119,392 (Childs) discloses an inline CSO predistortion circuit for use with a laser diode. The predistortion circuit includes a field effect transistor (FET) biased for square law operation that generates a mostly CSO predistortion. Due to field and doping dependent variations in carrier mobility of a FET, the actual distortion may deviate from pure CSO distortion toward CTB or odd order distortion. Since there are difficulties in achieving the ideal CSO distortion and a very good RF frequency response across wide frequency bands, such as is required for CATV applications, by using single stage FET amplifiers, the performance of this predistortion circuit is limited.

It is advantageous for a predistortion circuit to correct for both CSO and CTB distortion over a broad frequency range. However, existing prior art solutions require the use of numerous complex distortion circuits, each circuit correcting a limited portion of the broad frequency range to be transmitted by laser. For example, U.S. Pat. No. 5,523,716 (Grebliunas) discloses an in-line CTB predistortion circuit for satellite applications. Because of the different frequency range, bandwidths and power ranges, this design is inappropriate for and not transferable to CATV applications. Satellite applications operate at a much higher frequency range and over a limited frequency band. CATV applications operate over several octaves, which is much greater than satellite applications. Also, since the power in a satellite application is much greater than for a CATV application, the diodes used in a satellite application are biased at zero (0) volts. In contrast, for CATV applications, the diodes must be forward biased because of their lower RF signal power levels.

U.S. Pat. No. 6,204,718 (Pidgeon) discloses a combination of two different and separate predistortion circuits that must be combined to provide CSO distortion correction across a wide frequency range.

U.S. Pat. No. 5,600,472 (Uesaka) discloses an in-line CSO distortion circuit, as shown in FIG. 1. The effectiveness of the prior art circuit shown in FIG. 1 is limited by at least two factors. First, the RF attenuator is AC coupled to the nonlinear diode through at least one DC blocking capacitor, which in this example are capacitors C11, C12 and C13. Second, the high resistance values of the DC biasing circuit (compared to the diode difference resistance), which produces the bias voltage for diode D11, are sufficiently high that they prevent the blocking capacitors from discharging and adversely affecting the diode nonlinear correction current. U.S. Pat. No. 5,798,854 (Blauvelt et al.) discloses a CSO predistortion circuit similarly limited by resistors R22, R23 and blocking capacitor C21, as shown in FIG. 2.

Theoretically, during operation of an inline predistortion circuit, the RF signal current flows through an attenuator before flowing to the laser and the attenuator samples the RF current that the laser receives. The current sample creates a voltage across the attenuator. Nonlinear current produced by a Schottky diode connected in parallel with the attenuator provides CSO correction.

However, in the prior art, the DC blocking capacitors affect the voltage across the diode. The charge stored on the capacitors creates an average voltage, rather than an instantaneous voltage relative to the RF signal. An average voltage then results in an average correction current out of the diode. Therefore, an average inverse compensation current is used to predistort the RF signal input to the laser rather than an instantaneous current.

When such prior art circuits experience linear current from the RF input signal, the DC blocking capacitors block only the unwanted DC components. However, when the prior art circuits experience nonlinear current, the DC blocking capacitors in the inverse compensation circuit charge when the diode is forward biased (on), and discharge through high DC bias resistance when the diode is reverse biases (off). Because the resistance through which the capacitors must discharge is sufficiently large, an electrical charge accumulates and is maintained on the capacitor. The compensation circuit then provides an average compensation current rather than an instantaneous compensation current, greatly reducing the accuracy of the predistortion circuit.

The charge accumulated and maintained on the DC blocking capacitors of the prior art create an adverse affect on the predistortion circuit that is actually three-fold. First, the voltage drop across the diode is reduced, which reduces the RF drive efficiency of the diode by reducing the inverse compensation current it produces. Second, the charging and discharging of the DC blocking capacitor causes a timing offset in the inverse compensation current. The variation of the charge on the capacitor depends on the variation of the RF input signal as it goes through its positive and negative cycles charging and discharging the capacitor to the extent allowed by the time constant of the circuit. The resulting voltage change across the diode is no longer instantaneously proportional to the nonlinearity of the laser. Third, because of the average voltage stored in the DC blocking capacitor, the positive RF drive voltage across the diode is significantly less than the positive RF voltage across the RF attenuator. To apply a sufficient voltage across the diode to turn it on during the positive RF signal cycle, the resistance value of the attenuator is increased proportionally to perform voltage division between the diode and the DC coupling capacitor. To compensate for the increased resistance, the power of the RF input signal is also proportionally increased, which increases third order distortion in the signal. The RF waveform operating on the diode will be different from the RF waveform operating on the attenuator, which increases third order distortion in the laser output signal.

Based on the above, the prior art predistortion solutions clearly lack appreciation of the controlling factors for providing the most efficient and effective predistortion control.

Hence, a need exists for a predistortion circuit with improved nonlinear current levels to reduce or eliminate both the CSO and CTB distortion produced by a DFB laser diode across a broad frequency range. The present invention solves the problems of the prior art and satisfies these needs in a simple single circuit.

SUMMARY

An inline predistortion circuit for producing composite second order (CSO) and composite triple beat (CTB) distortion correction for a laser transmitter is disclosed having an RF input signal, a nonlinear current compensation circuit without DC blocking capacitors, and a low resistance DC bias circuit for controlling the operating point of the nonlinear device. Several optional features of the predistortion circuit provide accuracy for correcting laser transmitter distortion.

A low resistance resistor in series with the RF signal path and in parallel with the diode acts as an attenuator to provide the voltage necessary to set the operating point of the diode while minimizing RF signal attenuation. Providing two diodes in series increases the correction capability of the nonlinear current. Inclusion of a high frequency pass filter coupled in parallel with the RF signal will further enhance performance across a wider frequency range. Further inclusion of a discharging capacitor further increases capability of the diode for producing nonlinear correction current. Further inclusion of an inductor in series with the RF signal provides improved phase correction of the CSO and CTB predistortion circuit. Further inclusion of a temperature compensation circuit reduces the effect of temperature variations on the correction circuit. The overall result provided by the current compensation circuit that is free of DC blocking capacitors, in combination with any or all of these enhancements, is CSO and CTB distortion correction that is greatly superior in accuracy to prior art predistortion solutions.

BRIEF DESCRIPTION OF THE DRAWINGS

The present invention will hereinafter be described in conjunction with the appended drawing figures, wherein like numerals denote like elements, and.

DETAILED DESCRIPTION OF THE PREFERRED EMBODIMENT(S)

Figure 1:
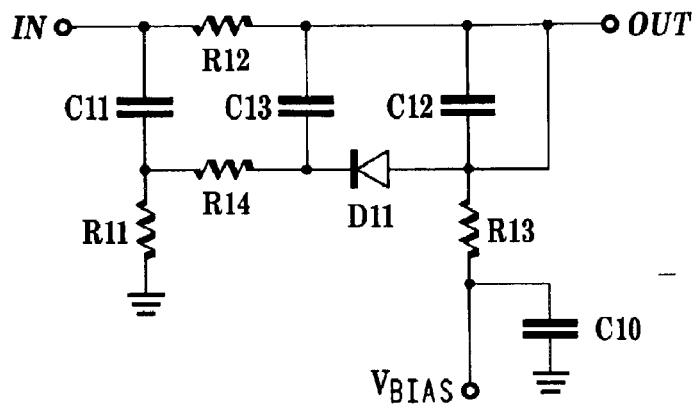
FIGS. 1 and 2 show typical prior art CSO predistortion circuits.
Figure 2:
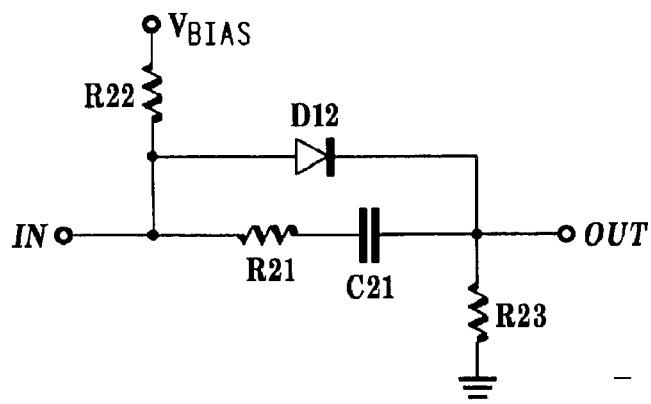
Figure 3:
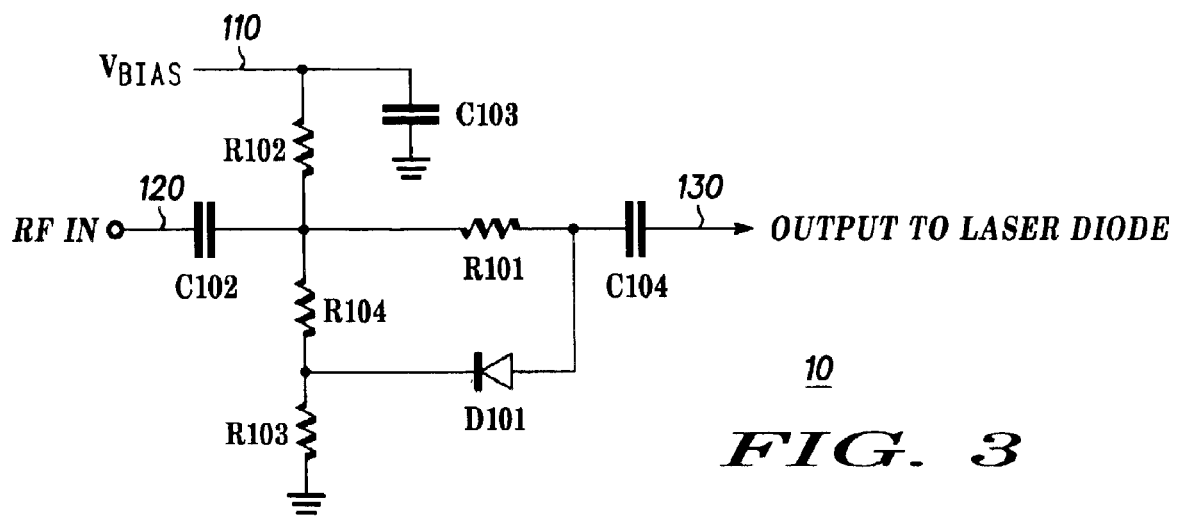
FIGS. 3 and 4 show novel inline CSO and CTB predistortion circuits.

Referring to FIG. 3, a predistortion circuit 10 in accordance with the present invention is shown. The predistortion circuit 10 comprises an RF input 120, a DC bias voltage input 110, a diode D101 and an RF attenuator. The RF attenuator is preferably designed to match the characteristic impedance of the system, in this case the 75-ohm characteristic impedance used by a CATV system. The RF attenuator includes capacitors C102, C103, C104; resistors R101, R102, R103, R104; and output 130 to a laser diode, such as a distributed feedback (DFB) laser diode. A typical RF signal level at input 120 to the circuit is 35 dBmv/channel with 110 channels. Capacitors C102, C103 and C104 are used to provide DC blocking. Resistors R102, R103 and R104, in combination with DC bias 110, provide control of the forward bias to diode D101. The nonlinear distortion correction is produced by diode D101, which is directly connected in parallel with resistors R101 and R104. Since coupling capacitors between diode D101 and resistors R101 and R104 are omitted, the effect of the charge on the coupling capacitors is averted.

In operation, the RF current flowing through resistor R101 causes RF voltage to appear across the diode D101. When the forward voltage across the diode D101 increases, more RF current will flow through the diode D101, causing the momentary decrease in the insertion loss of the RF attenuator circuit. The current flowing through the diode D101 generates CSO distortion, which is used for inline distortion correction. As the magnitude of the current flow through the diode D101 increases, so does the magnitude of the second order CSO distortion, and thereby the second order CSO correction. The RF nonlinear correction current from the diode D101 also compensates for CTB distortion, thereby providing a single circuit that corrects for both second and third order distortion.

In the prior art, the voltage drop across the RF attenuator is increased to compensate for the accumulated voltage drop across the AC coupling capacitor. The present invention uses a resistance/impedance value that is low compared to the value required by the prior art. Therefore the present invention minimizes third order distortion. Furthermore, since the present invention does not include coupling capacitance, the novel circuit provides instantaneous predistortion correction to the RF signal.

Figure 5:
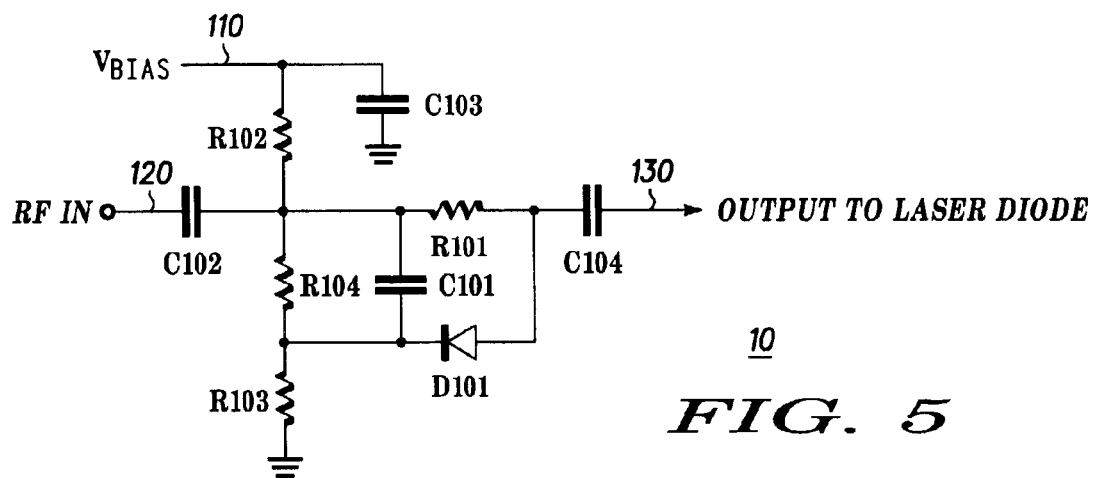
FIGS. 5 and 6 show inline predistortion circuits of FIGS. 3 and 4 with further improved CSO correction.

In an alternative embodiment of the present invention shown in FIG. 5, a capacitor C101 is connected in parallel to resistor R104, in an otherwise identical circuit to that shown in FIG. 3. The purpose of the capacitor C101 is to further increase the forward RF current through diode D101. The accumulated charge in the capacitor C101 can be easily discharged by the parallel low value resistor R104 (20–200 ohms), thus averting the problem of accumulated capacitor. Compared with FIG. 3, the predistortion circuit 20 of FIG. 5 provides an improved (1–2 dB) CSO correction, whereas the correction circuit of FIG. 3 will improve CTB correction. In practice, the DC bias current for driving the diode limits the minimum resistance of resistor R104. The tradeoff is between correction performance and power dissipation, which can be selected by the system designer in light of system requirements.

Figure 4:
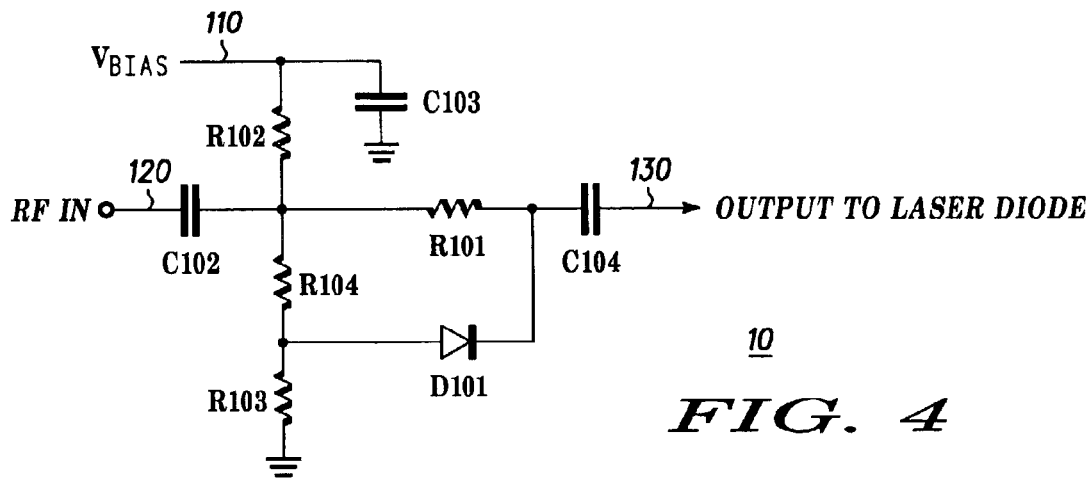
Figure 6:
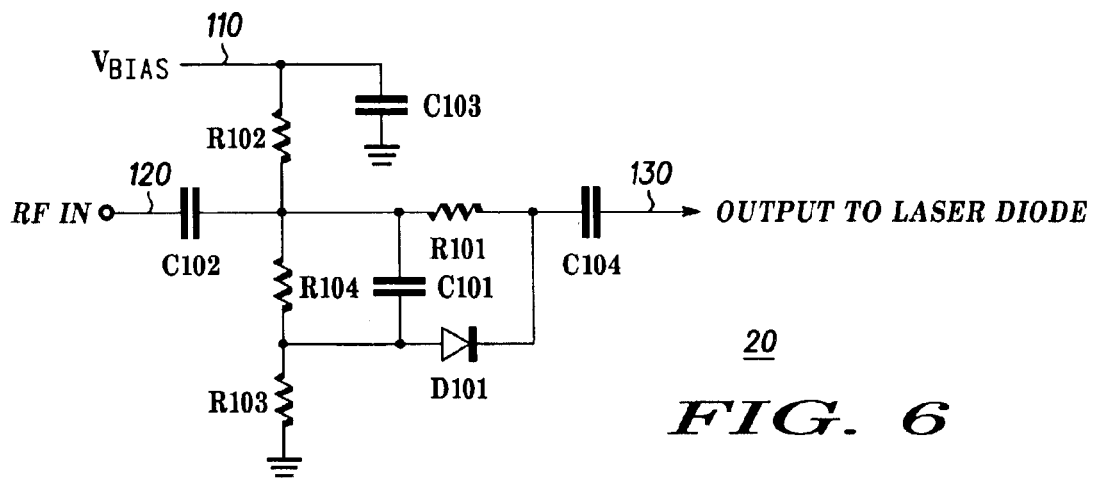
Figure 7:
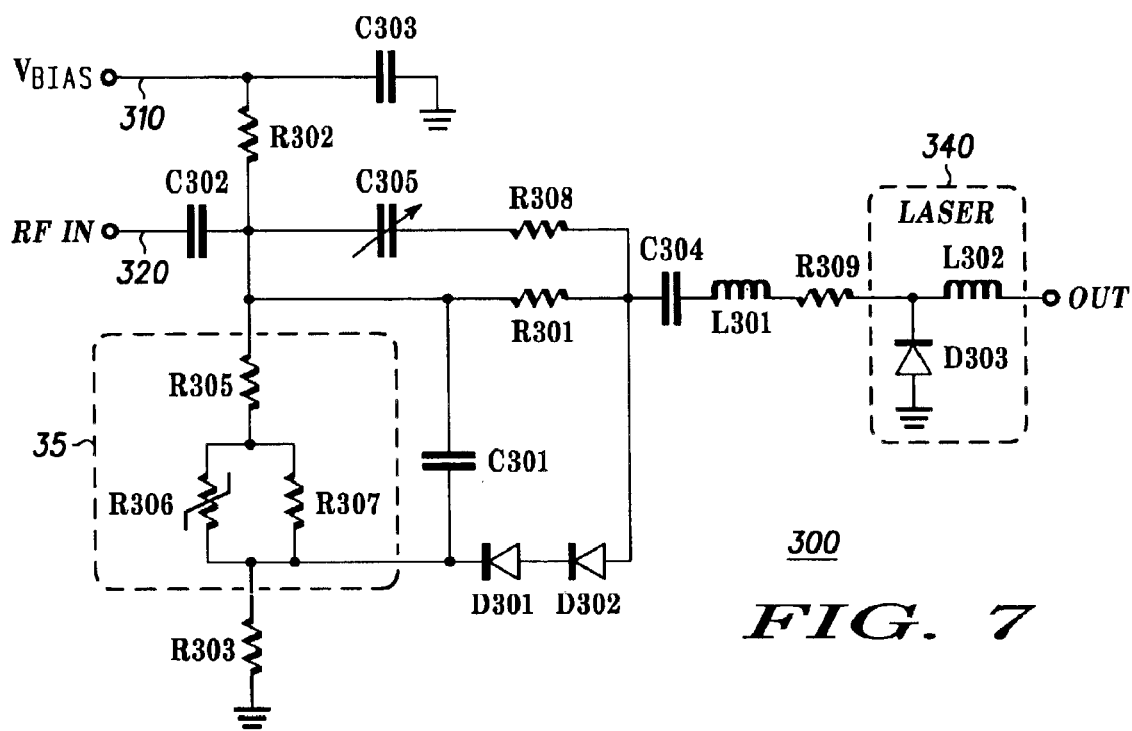
FIG. 7 shows a novel enhanced inline CSO and CTB predistortion circuit including temperature compensation.

The predistortion produced by circuits shown in FIGS. 4 and 6 differ from FIGS. 3 and 5 only in that the CSO distortion is of the opposite polarity due to the reverse configuration of the diode D101. This polarity modification is useful so that either sublinear or superlinear laser diode distortion can be corrected. When a laser is pushed to an optical output power higher than the laser power rated by the vendor, laser distortion is always sublinear. For such applications, a diode configuration as shown in the circuits of FIGS. 3, 5 and 7 would be needed to correct for the laser diode distortion.

Table 1 provides a listing of the components shown in FIGS. 3, 4, 5 and 6. However, one skilled in the art would clearly recognize that the values shown in Table 1 are only for exemplary purposes, and should not be considered to be limiting to the invention. For example, resistor R104 could range between 20 ohms and 400 ohms depending on the forward diode differential resistance.

TABLE 1

| COMPONENT | SPECIFICATION |
| --- | --- |
| D101 | Schottky SMS 7621 |
| R101 | 5 ohms |
| R102 | 2400 ohms |
| R103 | 2400 ohms |
| R104 | 100 ohms |
| C101 | 20 pF |
| C102 | 0.1 µF |
| C103 | 0.1 µF |
| C104 | 0.1 µF |

FIG. 7 shows another alternative embodiment of the present invention, comprising a predistortion circuit 300 that includes temperature compensation for predistortion to laser circuit 340. Predistortion circuit 300 is an enhanced version of predistortion circuit 20, comprising: a DC bias control input 310; and RF input 320; capacitors C301, C302, C303, C304; resistors R301, R302, R303, R305, R306, R307, R308, R309; inductor 301; and two diodes D301, D302. A laser circuit 340 is coupled to the output of the predistortion block 30, comprising: an inductor L302 and laser diode D303. The inductor L302 is commonly included in the laser package.

The capacitors C302, C303 and C304 of predistortion circuit 300 are used to provide DC blocking in the distortion circuit. Two Schottky diodes D301 and D302 are coupled in series for providing the nonlinear distortion correction. A combination of resistors R305, R307 and thermistor R306 provide both temperature compensation, and control of the forward bias to diodes D301 and D302 in combination with resistors R302 and R303, and DC bias input 310. Resistor R301 is connected in parallel with the series combination of resistor R308 and variable capacitor C305. Capacitor C301, by its value and its parallel configuration with resistors R305, R306 and R307, allows increased RF current flow through diodes D301 and D302. An inductor L301 is connected between diodes D301, D302 and the laser 340 through capacitor C304 and match resistor R309. Resistor R309 is approximately 45 ohms, which is the value needed to match the 75 ohm impedance of CATV RF systems.

The predistortion circuit 300 shown in FIG. 7 includes several enhancements to predistortion circuit 20 of FIG. 5. The two diodes D301, D302 coupled in series replace the single diode D101 of FIG. 5 in order to increase the distortion correction ability of the circuit. As with resistor R101 of FIG. 5, resistor R301 determines the RF voltage across diodes D301, D302. Since the 10 ohm value of the R301 resistor in FIG. 7 is twice the 5 ohm value of resistor R101 in FIG. 5, the RF voltage drop on the single diode D101 of FIG. 5 is equivalent to each of the two diodes D301, D302 in FIG. 7. Therefore, predistortion circuit 300 maintains the same operating point for the diodes while providing twice the CSO correction as compared to predistortion circuit 20.

The circuit shown in FIG. 7 also includes elements for frequency and phase correction not found in FIG. 5. A high frequency pass filter, comprising a variable capacitor C305 and resistor R308, is used in parallel with resistor R301 for distortion correction performance enhancement in order to maintain high correction ability across a wide frequency band. The frequency band for CATV applications is 55 MHz to 860 MHz in the downstream direction. The corrected frequency band can be widened, shifted or narrowed as needed to provide optimal performance in another application. The inductor L301 in FIG. 7 is used to control the phase of the correction current so that the CSO and CTB distortion correction performance can be further improved.

A combination of resistors R305, R307 and thermistor R306 in FIG. 7 combine to form temperature compensation circuit 35 that replaces the resistor R104 in predistortion circuit 20 of FIG. 5. Having a temperature compensation circuit 35 integrated into the predistortion circuit 300 has the advantage of negligible power dissipation as compared to placing the thermistor outside the bias circuit, as disclosed in U.S. Pat. No. 6,140,858. Since the applied bias voltage is significantly greater than that of the voltage inside of the predistortion circuit, placing the thermistor within the high voltage section of the bias circuit would create large power dissipation on itself, causing inaccurate sensing of the temperature. In the present invention, the power dissipation on the thermistor R306 is insignificant at about 0.2 mW, thereby providing reliable and improved temperature compensation.

The specifications for the components of which the distortion circuit 300 in FIG. 7 comprises are shown in Table 2. The values shown in Table 2 are only for exemplary purposes and should not be considered to be limiting to the invention.

TABLE 2

| COMPONENT | SPECIFICATION |
| --- | --- |
| C301 | 20 pF |
| C302 | 0.1 $\mu$F |
| C303 | 0.1 $\mu$F |
| C304 | 0.1 $\mu$F |
| C305 | 1–5 pF (variable) |
| R301 | 10 ohms |
| R302 | 2400 ohms |
| R303 | 2400 ohms |
| R305 | 50 ohms |
| R306 | 100 ohms Thermometrics BR 42KA 101J |
| R307 | 100 ohms |
| R308 | 18 |
| R309 | 45 ohms |
| D301 | Alpha Industries Schottky SMS 7621 |
| D302 | Alpha Industries Schottky SMS 7621 |
| D303 | Fujitsu CZ-S6 |
| L301 | 1.5 nH |
| L302 | Internal to laser |

Using the circuit as shown in FIG. 7, CSO distortion correction can be greater than 10 dB across the 55–750 Mhz frequency range, while at the same time, the CTB distortion is improved. It should be noted that the CTB distortion is improved with or without using inductor L301. Therefore, using the predistortion circuit 300 as shown in FIG. 7, both CSO and CTB distortion corrections are achieved with a single circuit.

Figure 8:
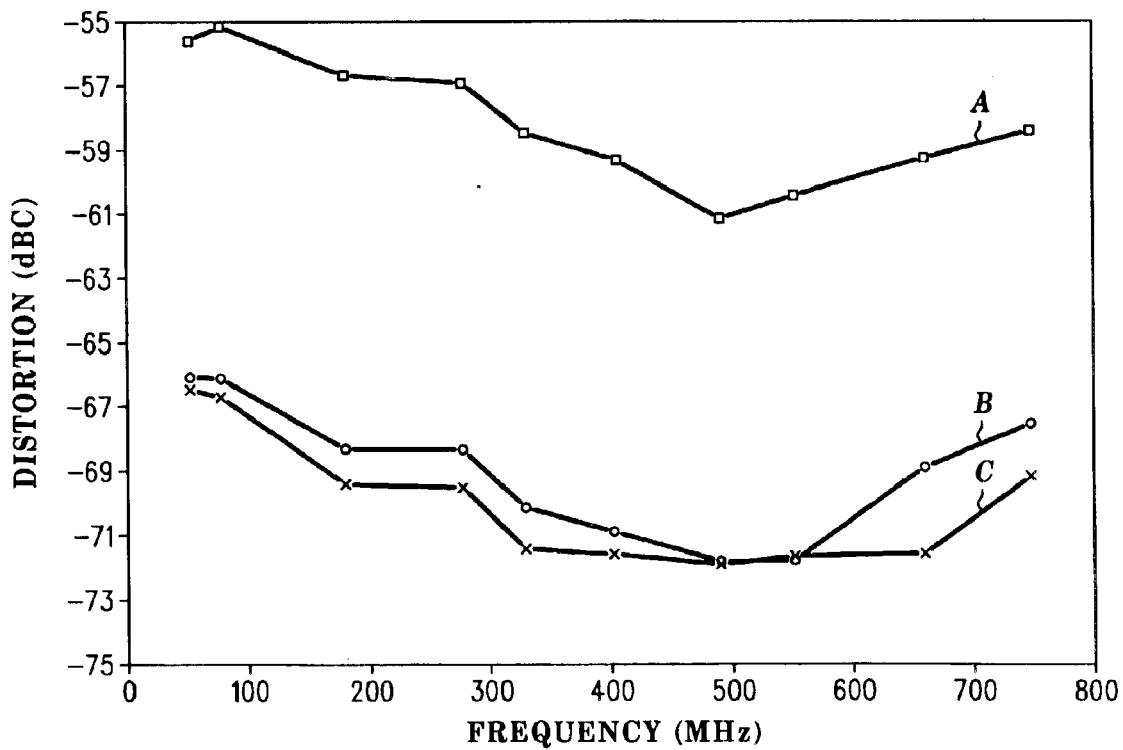
FIG. 8 graphically shows CSO distortion correction of a laser diode using the predistortion circuit shown in FIG. 7.

FIG. 8 graphically shows the results of CSO distortion correction using the circuit shown in FIG. 7. The worst-case raw CSO distortion curve A shown in FIG. 8 is for a laser diode with an 11 dBm rated output at an output level of 12.5 dBm. Curve B shows the 10 dB distortion correction that results from the inline distortion circuit 300 of FIG. 7. An additional 1–2 dB increase in CSO distortion correction is gained, as shown in curve C, when inductor L301 is included in the inline distortion circuit 300. The effected reduction in CSO distortion is approximately 12 dB.

Figure 9:
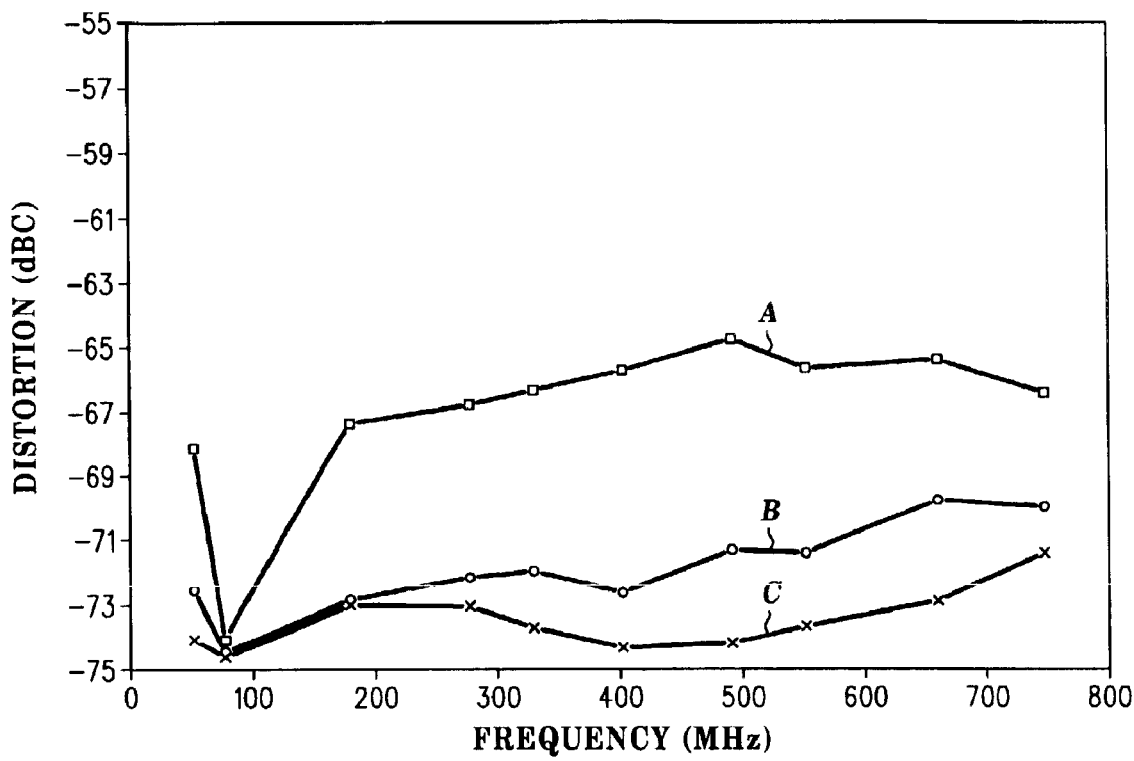
FIG. 9 graphically shows CTB distortion correction of a laser diode using the predistortion circuit shown in FIG. 7.

In FIG. 9, the results of CTB distortion correction is compared with the worst case raw CTB distortion of the same laser diode at 1.5 dBm above its rated output, shown in curve A. Without the inductor L301 of inline distortion circuit 300, a 2–7 dB reduction in CTB distortion is achieved as shown by curve B. Using the inductor L301 in circuit 300 provides an additional 1–3 dB improvement in CTB distortion, as shown by curve C. All the experimental data are using original lab test data without correcting for the noise floor. Generally, using the noise floor correction provides better results.

Tests were also performed for operation at various temperatures in the range of 0 degrees C. to 55 degrees C. Both second order and third order distortion variations were within one to two dB over the useful frequency range for CATV.

Figure 11:
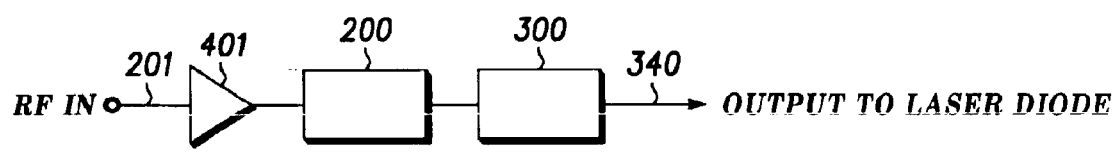
FIGS. 11 and 12 show novel variations for arrangement of an RF amplifier with the CSO and CTB predistortion circuit shown in FIG. 7 and the CTB predistortion circuit shown in FIG. 10
Figure 12:
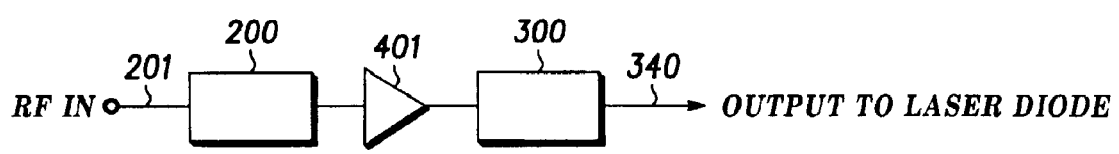

For further improvement of CTB correction, the predistortion circuit 300 shown in FIG. 7 can also be combined with a separate CTB predistortion circuit for further improving the overall correction performance. In accordance with the present invention, at least two arrangements of CSO and CTB predistortion circuits combined with an RF amplifier are described herein. FIGS. 11 and 12 show two such possible options, where block 200 represents a separate auxiliary CTB predistortion circuit, such as that disclosed in U.S. Pat. No. 6,109,877, and block 300 represents the distortion correction circuit of FIG. 7. In FIG. 11, a CTB predistortion circuit 200 is cascaded with the inline distortion correction circuit 300, whereby the input RF signal has been amplified first by amplifier 401, before passing through the cascaded correction circuits. In an alternative embodiment shown in FIG. 12, the RF signal is corrected by the CTB predistortion circuit 200, then amplified at amplifier 401 and finally corrected by the CSO predistortion circuit 300 before being outputted to the DFB laser.

Figure 10:
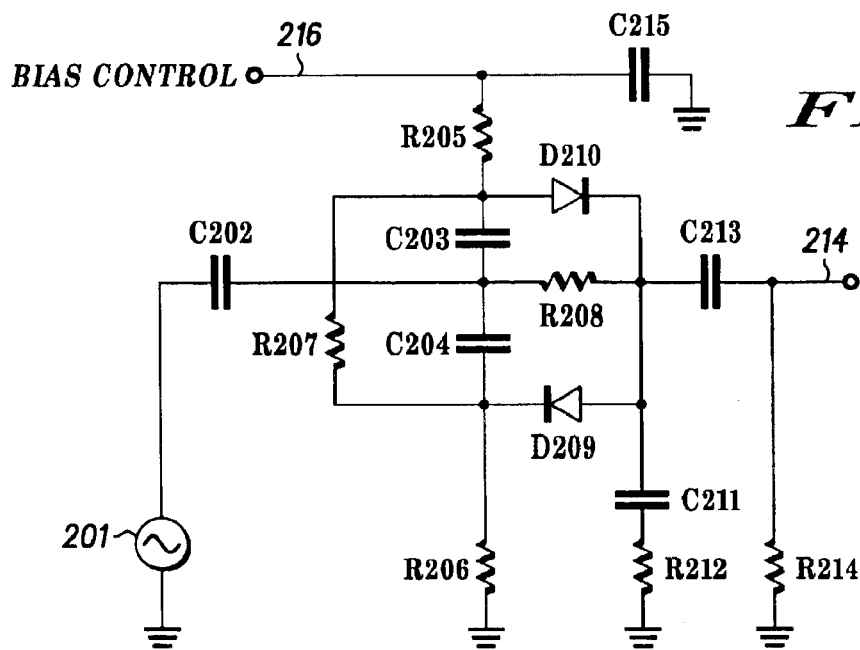
FIG. 10 shows a novel CTB inline predistortion correction circuit.

FIG. 10 shows a CTB predistortion circuit represented by block 200 in FIG. 11 and 12. Referring to FIG. 10, a detailed description of the CTB distortion block 200 follows.

The function of the resistors R205, R206, R207, R208, R212 and the capacitors C202, C203, C204, C211, C213, C215 is to form a modified $\pi$ attenuation network. Capacitors C202, C203, C204, C211, C213, and C215 are also used for DC blocking and AC coupling.

The other function for resistors R205, R206, and R207 is to supply a DC bias to the diodes D209, D210. Diodes D209, D210 are first connected in series, and the series combination is connected in parallel to resistor R207. Resistor R207 has a low resistance value and controls the voltage drop across the diodes D209, D210. If the current flow in resistor R207 is much more than the current flow in the diodes D209, D210, the voltage drop across the diode D209, D210 will be very stable and insensitive to the presence or absence of a signal at the input port 201.

The integrated functions of signal attenuation and diode bias supply avoid any parasitic effects due to the introduction of additional bias circuitry. This permits a high frequency response and a favorable impedance match.

From a DC perspective, resistor R207, in parallel with capacitors C203 and C204, provides a dissipative circuit to the capacitors C203, C204. Resistor R207 allows discharging of the accumulated electric charge of connected capacitors C203, C204 in every AC cycle.

Diode D209 is connected to resistor R208 through capacitor C204 while diode D210 is connected to resistor R208 through capacitor C203. Diode D209 is responsible for the RF distortion correction during the negative portion of the AC cycle, while the diode D210 has the same function during the positive half of the AC cycle. The nonlinear current of diode D209 charges capacitor C204, and the nonlinear current of diode D210 charges capacitor C203. Due to the configuration of the circuit, the voltage produced on capacitors C203 and C204 have the same value but different signs. The small resistance from resistor R207 connected to the capacitors C203, C204 discharges the accumulated electric charge during every AC cycle. As a result, there is no additional DC voltage drop across the capacitors C203, C204 for the RF input signal. This permits the diode D209, D210 to provide the largest nonlinear current for the correction purpose similar to the function of capacitors C101, C301 of FIGS. 5, 6 and 7.

Due to its symmetric structure, the CTB predistortion block 200 produces only odd order distortion. Consequently, the circuit does not degrade the CSO performance of a laser transmitter load device. The CTB predistortion block 200 uses resistance R208. The value of this resistor is small compared to the prior art. Resistor R207 significantly improves the correction efficiency and reduces the susceptibility to ambient temperature effects. Resistor R208 provides for distortion correction with low insertion losses. Due to the design of CTB predistortion block 200, the voltage drop across resistor R208 fully loads the diodes D209, D210 even under nonlinear operation of the diodes D209, D210. As a result, maximum nonlinear current is utilized for correction purposes. Finally, proper phasing of the distortion signals is inherent in the design, thereby avoiding additional phase circuitry and delay lines. This permits a circuit design that is much less complex and results in a compact and robust design.

Table 3 provides a listing of the components that CTB predistortion block 200 comprises. However, one skilled in the art would clearly recognize that the values shown in Table 3 are only for explanatory purposes, and should not be considered to be limiting to the invention. For example, the value of resistor R208 may range from approximately 2Ω to 30Ω. Likewise, the value of resistor R207 may range from approximately 20Ω to 500Ω.

TABLE 3

| COMPONENT | VALUE OR IDENTIFICATION |
| --- | --- |
| C202 | 0.1 μF |
| C203 | 0.1 μF |
| C204 | 0.1 μF |
| R205 | 6K Ω |
| R206 | 6K Ω |
| R207 | 330 Ω |
| R208 | 7.5 Ω |
| D209 | HP HSMS-2822#L30 |
| D210 | HP HSMS-2822#L30 |
| C211 | 0.1 μF |
| R212 | 3K Ω |
| C213 | 0.1 μF |
| R214 | 75 Ω |
| C215 | 0.1 μF |

As previously described, the CTB predistortion block 200 uses the nonlinear current produced by the diodes D209, D210 to compensate for the compression caused by a nonlinear laser device. The diodes are the only components that are sensitive to temperature change. There are three factors which must be taken into consideration when operating the CTB predistortion block 200 with respect to temperature compensation:

1) The diode operating current will change if the bias voltage remains constant while the ambient temperature changes. Under the same input voltage swing at the input port 201 and the same bias voltage, more nonlinear diode current will be created as the ambient temperature rises;

2) When the ambient temperature rises, the diode will produce less nonlinear correction current for the same input signal voltage and the same diode bias current; and 3) Nonlinear devices typically exhibit more distortion as the ambient temperature rises; a higher diode nonlinear current is required for correction of the greater distortion, accordingly.

All of the temperature effects experienced by the CTB predistortion block 200 are related to the bias voltage. Some of the effects are additive while others are subtractive. However, the result is that for a given temperature, there will be an optimum bias voltage to produce the proper correction output. Proper temperature correction will be achieved when the change of bias voltage versus temperature is known and/or can be accurately controlled. The temperature compensation circuit of FIG. 7 can be used in FIG. 10 to improve the temperature stability of the circuit.

While the principles of the invention have been described above in connection with specific apparatus, it is to be clearly understood that this description is made only by way of example and not as a limitation on the scope of the invention.

What is claimed is:

1. An inline predistortion circuit for producing second and third order distortion correction of a laser transmitter having an RF input signal, wherein said circuit comprises:
a DC voltage bias coupled to a first, a second and a third resistor in series to form a voltage divider; the third resistor being coupled to ground;
a fourth resistor coupled in series between an input port and the laser transmitter, thereby forming an inline path for the RF input signal; and
a diode coupled to the third resistor and in parallel with the fourth resistor, with said second resistor coupled between the diode and the fourth resistor; and
whereby the predistortion circuit is free from capacitors coupled between the diode and the fourth resistor.

2. The inline predistortion circuit of claim 1 further comprising:
a second diode connected in series with said first diode;
a fifth resistor and a first thermistor coupled in a parallel combination, said combination coupled in series with said second resistor;
a sixth resistor and a first capacitor coupled in series, together coupled in parallel with said fourth resistor; and
a first inductor coupled between said fourth resister and said laser transmitter for correcting the phase of the predistortion circuit thereby improving cancellation of the laser transmitter's CSO distortion.

3. The inline predistortion circuit of claim 2 further comprising:
a second capacitor for blocking DC current, coupled in series between the RF input and the parallel combination of the fourth resistor and the diode; and
a third capacitor for blocking DC current, coupled in series between said laser transmitter and the parallel combination of said fourth resistor and diode.

4. The circuit of claim 2 further comprising:
an RF signal amplifier coupled between said RF input signal and said inline predistortion circuit;
a separate CTB distortion producing circuit coupled in series between said inline predistortion circuit and said RF input signal for providing additional CTB distortion correction.

5. The circuit of claim 1 whereby the fourth resistor has a resistance sufficient for producing enough voltage to allow the diode to conduct while maintaining an RF attenuation for the circuit below 0.5 dB.

6. The circuit of claim 1 whereby CSO distortion correction is approximately 10–12 dB and CTB distortion correction is approximately 2–10 dB.

7. An inline predistortion circuit for producing second and third order distortion correction of a laser transmitter having an RF input signal, wherein said circuit comprises:
- a DC bias voltage source coupled to a first, a second and a third resistor in series to form a voltage divider, the third resistor being coupled to ground;
- a fourth resistor coupled in series between an input port and the laser transmitter, thereby forming an inline path for the RF input signal;
- a pair of diodes coupled to the third resistor and in parallel with the fourth resistor, with said second resistor coupled between the diode and the fourth resistor;
- a first capacitor in parallel with said second resistor;
- a fifth resistor and a first thermistor coupled in a parallel combination, said combination coupled in series with said second resistor;
- a sixth resistor and a second capacitor coupled in series, together coupled in parallel with said fourth resistor; and
- a first inductor coupled between said fourth resister and said laser transmitter.

8. The inline predistortion circuit of claim 7 further comprising:
- a third capacitor for blocking DC current, coupled in series between the RF input and the parallel combination of the fourth resistor and the diode; and
- a fourth capacitor for blocking DC current, coupled in series between said laser transmitter and the parallel combination of said fourth resistor and diode.

9. The circuit of claim 7 further comprising:
- an RF signal amplifier coupled between said RF input signal and said inline predistortion circuit;
- a separate CTB distortion producing circuit coupled in series between said inline predistortion circuit and said RF input signal for providing additional CTB distortion correction.

10. The circuit of claim 7, whereby the fourth resistor has a resistance sufficient for producing enough voltage to allow the diode to conduct while maintaining an RF attenuation for the circuit below 0.5 dB.

11. The circuit of claim 7, whereby CSO distortion correction is approximately 10–12 dB and CTB distortion correction is approximately 2–10 dB.

* * * * *